(12) United States Patent
Putter (10) Patent No.: US 8,779,831 B2
(45) Date of Patent: Jul. 15, 2014

(54) INTEGRATOR

(75) Inventor: Bas Maria Putter, Adliswil (CH)

(73) Assignee: ST-Ericsson SA, Plan-les-Ouates (CH)

( * ) Notice: Subject to any disclaimer, the term of this patent is extended or adjusted under 35 U.S.C. 154(b) by 18 days.

(21) Appl. No.: 13/378,889

(22) PCT Filed: Jun. 18, 2010

(86) PCT No.: PCT/EP2010/003692
§ 371 (c)(1),
(2), (4) Date: Feb. 25, 2012

(87) PCT Pub. No.: WO2010/145836
PCT Pub. Date: Dec. 23, 2010

(65) Prior Publication Data
US 2012/0139609 A1 Jun. 7, 2012

(30) Foreign Application Priority Data
Jun. 19, 2009 (EP) ..................................... 09251606

(51) Int. Cl.
*H03K 5/00* (2006.01)
(52) U.S. Cl.
USPC ............................ 327/336; 327/552; 327/558
(58) Field of Classification Search
USPC ................... 327/335–337, 551–559
See application file for complete search history.

(56) References Cited

U.S. PATENT DOCUMENTS

| | | | | |
|---|---|---|---|---|
| 4,243,114 | A | * | 1/1981 | Brouwer .................... 177/210 C |
| 4,516,158 | A | * | 5/1985 | Grainge et al. ................ 348/145 |
| 6,249,552 | B1 | | 6/2001 | Cana et al. |
| 6,909,321 | B2 | * | 6/2005 | Stanley ......................... 327/558 |
| 2004/0178938 | A1 | | 9/2004 | Pedersen |

FOREIGN PATENT DOCUMENTS

EP    1345300 A    9/2003

OTHER PUBLICATIONS

Robens, M. et al., "Capacitive Crosscoupling Biquad Polyphase Filter", Circuits and Systems, 2009. ICAS 2009 IEEE International Symposium on, IEEE, Piscataway, NJ, USA May 24, 2009, pp. 49-52 XP031479124 ISBN: 978-1-4244-3827-3.
Montagna, G. et al., "A 35-MW 3.6-MM2 Fully Integrated O.18-MUM CMOS GPS Radio", IEEE Journal of Solid-State Circuits, IEEE Service Center, Piscataway, NJ, US LNKD-DOI: 10.1109/JSSC.2003.813298, vol. 38, No. 7, Jul. 1, 2003.

* cited by examiner

*Primary Examiner* — Dinh T. Le
(74) *Attorney, Agent, or Firm* — Coats and Bennett, P.L.L.C.

(57) ABSTRACT

An integrator (100) comprises an amplification and phase shifting element (170) with a feedback path (130) forming a loop and comprising a capacitive element (140). An input signal is summed into the loop, and the loop is arranged to oscillate at an oscillation frequency higher than the frequencies of interest in the input signal. The loop includes a filter (160) for attenuating the oscillation signal to ensure that the amplification and phase shifting element (170) can provide amplification for the input signal. The input signal is integrated and the integrated signal perturbs the zero crossings of the oscillation signal.

17 Claims, 7 Drawing Sheets

INTEGRATOR

FIELD OF THE DISCLOSURE

The disclosure relates to an integrator and a method of integration, to a device comprising one or more integrators, and to a mobile communication device comprising such a device.

BACKGROUND TO THE DISCLOSURE

Integrators have application in a wide range of electronic circuits, for example, analogue-to-digital converters, particularly sigma-delta analogue-to-digital converters, digital-to-analogue converters, and filters, particularly loop filters in control loops. In many electronic devices utilising such circuits, and particularly in mobile electronic devices, low voltage operation and low power consumption is important. Adaptation of conventional circuits to low power operation can cause undesirable restriction of the permitted range of signal voltage swing and undesirable increase in power consumption, due, for example, to the need to use folded cascoding for increasing gain. Some circuits for reducing power consumption are impractical for use at low voltages. Therefore, there is a need for an improved integrator.

SUMMARY OF THE PREFERRED EMBODIMENTS

According to a first aspect there is provided an integrator comprising:

a loop operable to oscillate at an oscillation frequency, the loop comprising means for amplification, means for filtering and means for providing a phase shift;

a capacitive element series coupled in the loop;

means for summing into the loop an input signal having a bandwidth lower than the oscillation frequency; and an output for an oscillation signal dependent upon an integral of the input signal.

According to a second aspect there is provided a method of integration comprising:

generating an oscillation at an oscillation frequency by providing amplification, filtering and phase shifting in a loop;

providing a capacitance series coupled in the loop;

summing into the loop an input signal having a bandwidth lower than the oscillation frequency; and delivering from the loop an oscillation signal dependent upon an integral of the input signal.

Because the integrator and the method generate an oscillation signal dependent upon an integral of the input signal, low power consumption, low voltage circuitry can be employed, such as digital circuitry, and in particular standard cell inverters. Because the integrator and method employ an oscillating loop, no external clock is required and transitions in the oscillation signal are not restricted to periodic intervals, enabling quantisation noise to be reduced or eliminated.

The oscillation signal dependent upon an integral of the input signal can be pulse width modulated by an integral of the input signal. Such an oscillation signal can be amplified in a power efficient manner, and an integral of the input signal can be extracted from the oscillation signal by filtering. The oscillation signal may comprise pulses having a substantially rectangular shape, although other pulse shapes, such as substantially triangular or sinusoidal, may be employed.

The means for filtering can be operable to attenuate spectral components at the oscillation frequency relative to spectral components in the bandwidth of the input signal. Correspondingly, the method can comprise attenuating spectral components at the oscillation frequency relative to spectral components in the bandwidth of the input signal. In this way, the amplitude of signals in the loop comprising relatively low amplitude spectral components in the bandwidth of the input signal and relatively high amplitude spectral components at the oscillation frequency can be controlled. This can allow circuitry in the loop to be provided with signals within its dynamic range and, for example, enable digital circuitry to provide amplification of the spectral components in the bandwidth of the input signal.

The means for amplification and the means for providing a phase shift can be provided as an amplification and phase shifting element. The means for filtering can be coupled intermediate an output of the means for summing and an input of the amplification and phase shifting element. Alternatively, or additionally, the means for filtering can be coupled intermediate an output of the amplification and phase shifting element and an input of the means for summing. Correspondingly, the method can comprise performing the filtering after the summing and before the amplification and phase shifting, and/or performing the filtering after the amplification and phase shifting and before the summing. This feature provides flexibility in selecting an embodiment of the integrator or the method optimised for different requirements, for example according to the desired waveform of the oscillation signal at the output of the integrator.

The amplification and phase shifting element can comprise a first signal path having a first plurality of inverters coupled in series.

Inverters are able to provide a substantially two-level output signal, the level being dependent on whether the signal at an input is above or below a threshold. However, amplification can be provided by an inverter by appropriate selection of signal amplitude at its input, and phase shift can be provided by employing the finite rise time of a signal at its output. Also, the pulse width modulation can be readily introduced to the oscillation signal by summing the input signal with a signal in the oscillating loop having a finite rise time. Inverters can also have low complexity and low power consumption, and can operate from a low voltage. So, the use of an inverter enables the use of cascoding to be avoided and enables signals having a wide voltage swing, for example a rail-to-rail voltage swing, to be generated. Inverters can also have low complexity and low power consumption, and can operate from a low voltage.

Selection of the number of the plurality of inverters coupled in series enables selection of the amplification and phase shift occurring in the loop. This can ensure stable operation of the loop. Selection of the phase shift also enables a convenient oscillation frequency to be selected, the oscillation frequency being inversely dependent on the number of inverters in series.

The amplification and phase shifting element can comprise at least one further signal path including one or more parallel-coupled inverters coupled in parallel to one or more of the inverters of the first plurality of inverters of the first signal path. This feature provides flexibility in selecting an embodiment of the integrator having desired amplification and phase shift characteristics.

At least one of the further signal paths can include a phase shifting network. This feature provides flexibility in selecting an embodiment of the integrator having desired phase shift characteristics, a stable oscillation frequency, low complexity and low power consumption. In particular, the phase shifting network may be passive.

The integrator can be adapted to receive the input signal in a differential format and to deliver the oscillation signal in a differential format. Correspondingly, the method can comprise receiving the input signal in a differential format and delivering the oscillation signal in a differential format. Such a format can provide enhanced noise immunity.

In one embodiment, the means for amplification and the means for providing a phase shift may be provided as an amplification and phase shifting element, wherein the amplification and phase shifting element is adapted for processing the oscillation signal in a differential format and the amplification and phase shifting element may comprise: a differential input having a first differential component input and a second differential component input; a differential output having a first differential component output and a second differential component output; a first signal path having a first plurality of inverters coupled in series between the first differential component input and the first differential component output; a second signal path having a second plurality of inverters coupled in series between the second differential component input and the second differential component output; a first cross-coupled capacitive element coupled between the first differential component input and an output of one inverter of the second plurality of inverters; and a second cross-coupled capacitive element coupled between the second differential component input and an output of one inverter of the first plurality of inverters. This enables reduced power consumption by requiring less active circuitry.

At least one of the inverters can comprise a Standard Voltage Threshold (SVT) transistor. The use of an SVT transistor can reduce or obviate the need to use a High Voltage Threshold (HVT) or Low Voltage Threshold (LVT) process for low voltage operation, which can reduce the number of masks required for integrated circuit manufacture.

The series coupled capacitive element can comprise a series coupled resistive element. This feature can contribute to enhanced integrator performance at higher signal frequencies.

The integrator can be provided in a circuit comprising a filter coupled to the output of the integrator, the filter providing attenuation at the oscillation frequency. Accordingly, there is also provided a circuit comprising at least one integrator according to the first aspect and a filter coupled to the output of the at least one integrator for providing attenuation at the oscillation frequency. Such a circuit can be one of: a sigma-delta analogue-to-digital converter, a filter, a control loop, an analogue-to-digital converter, a digital-to-analogue converter.

The integrator provided in the circuit can together be provided in a mobile communication device. Accordingly, there is also provided a mobile communication device comprising such a circuit.

BRIEF DESCRIPTION OF THE DRAWINGS

The preferred embodiments will now be described, by way of example only, with reference to the accompanying drawings in which.

DETAILED DESCRIPTION OF THE PREFERRED EMBODIMENTS

Figure 1:
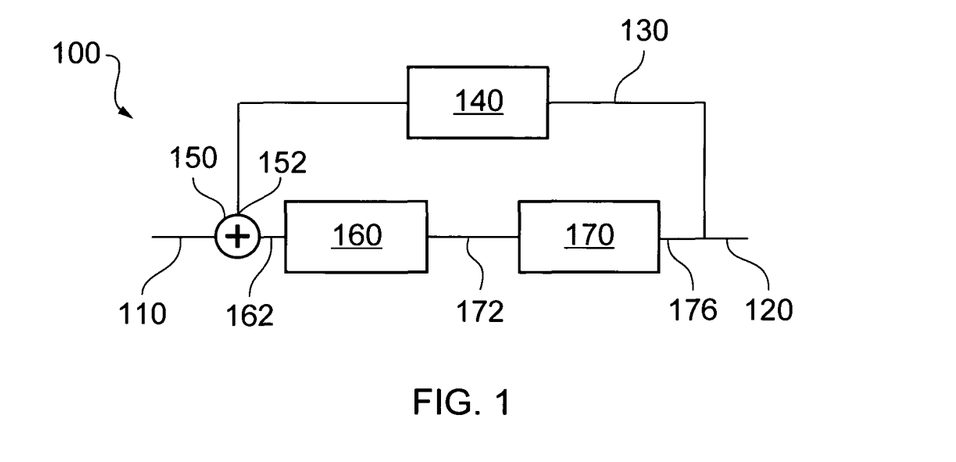
FIG. 1 is a schematic diagram of an integrator.

Referring to FIG. 1, an integrator 100 has an input 110 for an input signal and an output 120 for an oscillation signal dependent on an integral of the input signal. An amplification and phase shifting element 170 of the integrator 100 has an input 172 and an output 176. The output 176 of the amplification and phase shifting element 170 is coupled to the output 120 of the integrator 100 for delivering an oscillation signal dependent on the input signal.

There is a feedback path 130 coupled between the output 176 of the amplification and phase shifting element 170 and the input 172 of the amplification and phase shifting element 170, outside of the amplification and phase shifting element 170. The feedback path 130 and the amplification and phase shifting element 170 therefore in combination form a loop. The feedback path 130 causes oscillation in the loop. The frequency of oscillation is dependent on the amount of phase shift in the loop, in particular in the amplification and phase shifting element 170. The frequency of oscillation is arranged to be higher than the highest frequency of interest in the spectrum of the input signal, and can be selected to be, for example, ten times the highest frequency of interest in the spectrum of the input signal.

The feedback path 130 comprises a capacitive element 140. A first terminal of the capacitive element 140 is coupled to the output 176 of the amplification and phase shifting element 170 and a second terminal of the capacitive element 140 is coupled to a first input 152 of a summing stage 150. A second input of the summing stage 150 is coupled to the input 110 of the integrator 100. The summing stage 150 forms the sum of the input signal and a signal fed back from the output 176 of the amplification and phase shifting element 170 via the capacitive element 140. This sum is delivered at an output of the summing stage 150 which is coupled to an input 162 of a filter 160. An output of the fitter 160 is coupled to the input 172 of the amplification and phase shifting element 170.

The loop includes an inversion, as required for oscillation and integration. The inversion can be introduced by any of the loop components, that is by the amplification and phase shifting element 170, the summing stage 150 or the filter 160. In other embodiments, the inversion can be introduced by a separate inverting stage. Indeed, inversions may occur at a plurality of locations within the loop, provided that overall there is an odd number of inversions in the loop.

The capacitive element 140, in conjunction with the amplification provided by the amplification and phase shifting element 170 and the inherent input impedance of the summing stage 150 provides integration of the input signal. Furthermore, the summing by the summing stage 150 of the input signal and the oscillation signal in the loop causes the oscillation signal to be modulated by the integral of input signal, such that the oscillation signal is dependent on the integral of the input signal. In particular, as the oscillation signal has a finite rise time due to the finite bandwidth inherent in the elements of the loop, particularly the filter 160, the time at which the oscillation signal crosses a threshold, such as a voltage midway between minimum and maximum supply voltages, will be dependent on the input signal, or more specifically on the integral of the input signal. In this way the width of pulses in the oscillation signal can be modulated, thereby resulting in an oscillation signal pulse width modulated by an integral of the input signal.

The filter 160 attenuates spectral components at the oscillation frequency relative to spectral components in the bandwidth of the input signal. For example, the filter 160 may attenuate spectral components at the oscillation frequency and all higher frequencies by an equal amount, or the attenuation may increase for frequencies above the oscillation frequency. Without such attenuation, the amplitude of the oscillating signal at the input 172 of the amplification and phase shifting element 170 would increase to the minimum and maximum supply voltages, thereby saturating the amplification and phase shifting element 170 and preventing it from providing any amplification. Under such conditions the amplitude of the signal at both the input 172 and output 176 of the amplification and phase shifting element 170 would be identical and equal to the difference between the power supply voltage rails, and no amplification would occur. In particular, this condition would prevent the amplification and phase shifting element 170 from amplifying spectral components in the bandwidth of the input signal, and therefore prevent the integrator 100 from integrating the input signal. Therefore, the filter 160 ensures that the signal at the input 172 of the amplification and phase shifting element 170 is smaller than the input dynamic range of the amplification and phase shifting element 170, thereby ensuring that the amplification and phase shifting element 170 provides amplification. Typically, the amplification and phase shifting element 170 may provide amplification in the region of 50 to 70 dB. The amplification and phase shifting element 170 may saturate and delivers a voltage rail to voltage rail signal at its output 176, although this is not essential. The filter 160 does not attenuate, or provides a relatively low attenuation to, spectral components within the bandwidth of interest of the input signal applied at the input 120 of the integrator 100.

The oscillation frequency can be chosen at a convenient value to facilitate the filtering with minimal complexity. The oscillation frequency can also be chosen at a convenient value to facilitate subsequent recovery of the integrated input signal from the pulse width modulated signal by filtering, as described below. By way of example, in one embodiment the frequencies of interest in the input signal may occupy 0 to 10 MHz, the oscillation frequency may be 100 MHz, and the filter 160 may provide 0 dB gain for frequencies up to around 10 MHz and 25 dB attenuation for frequencies of 100 MHz and higher. In other embodiments, other values may be used for each of these parameters.

Figure 2:
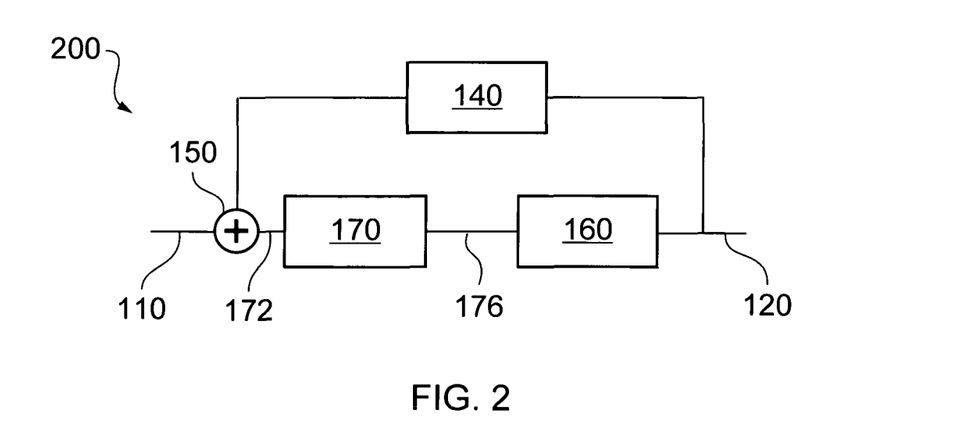
FIG. 2 is a schematic diagram of an integrator.

The components of the integrator 100 can be placed in a different order. For example, FIG. 2 illustrates an embodiment of an integrator 200 in which the order of the filter 160 and the amplification and phase shifting element 170 is reversed, the output of the summing stage 150 being coupled to the input 172 of the amplification and phase shifting element 170, and the output 176 of the amplification and phase shifting element 170 being coupled to the input of the filter 160. The output of the filter 160 is coupled to the first terminal of the capacitive element 140 and to the output 120 of the integrator 200. Alternatively, the output 120 of the integrator 200 can be coupled to the output 176 of the amplification and phase shifting element 170, according to whether it is desired to output the oscillation signal shaped by the filter 160 or prior to being shaped by the filter 160. Elements in common between FIGS. 1 and 2 have the same reference numeral in both FIGS. 1 and 2 and will not be described again.

Figure 3:
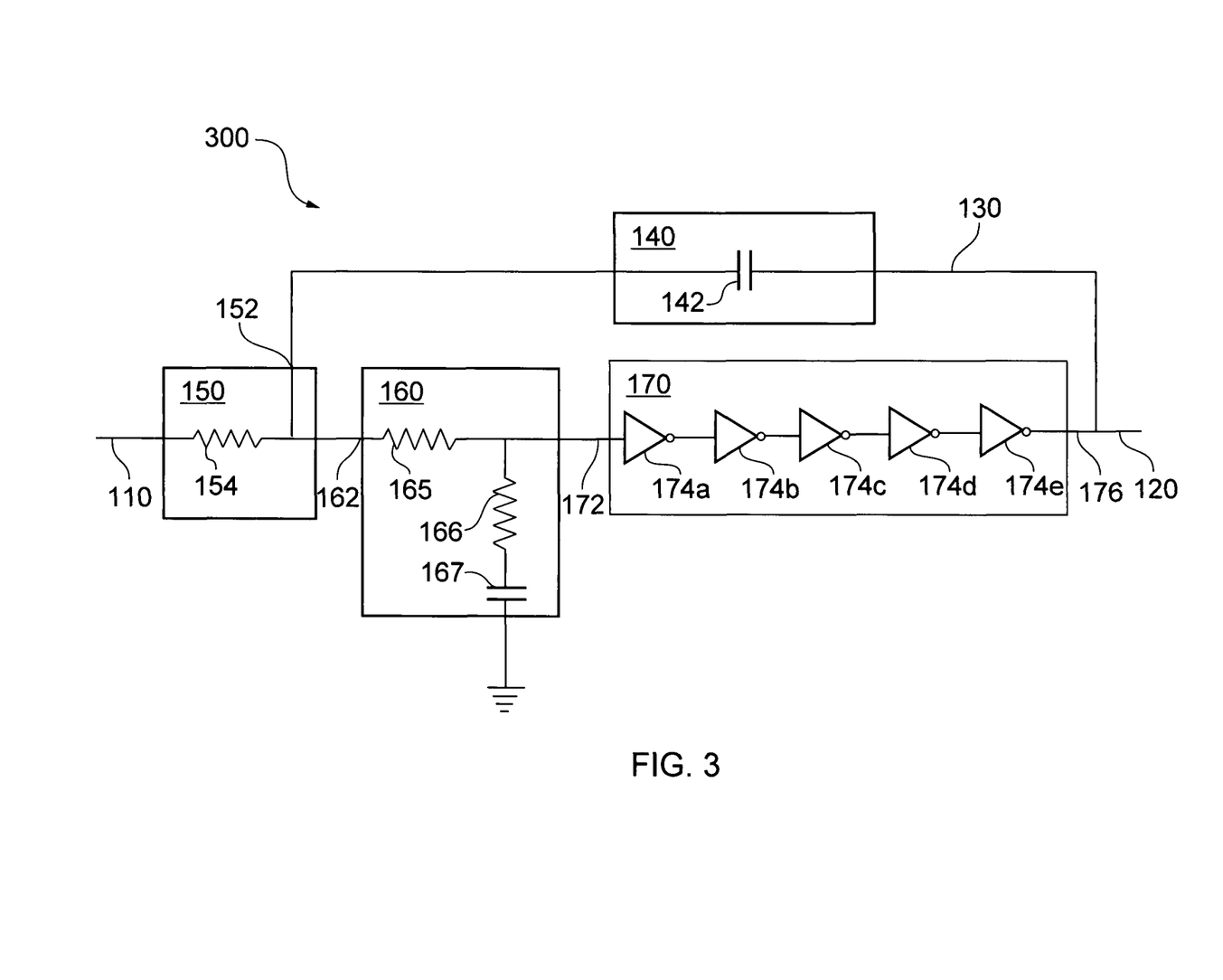
FIG. 3 is a schematic diagram of an integrator.

FIG. 3 illustrates in more detail an embodiment an integrator 300 of the form illustrated in FIG. 1. A first input of the summing stage 150 is coupled to the input 110 of the integrator 300. The summing stage 150 comprises a resistive element 154 coupled between the first input of the summing stage 150 and the output of the summing stage 150. A second input 152 of the summing stage 150 is coupled intermediate the resistive element 154 and the output of the summing stage 150. Electrical current in the resistive element 154 is summed with electrical current in the feedback path 130 at the point where the resistive element 154 is coupled to the loop.

The filter 160 has a resistive element 165 coupled between the input 162 of the filter 160 and the output of the filter 160. Coupled from intermediate the resistive element 165 and the output of the filter 160 to ground is a resistive element 166 in series with a capacitive element 167. The combination of the resistive elements 165, 166 and the capacitive element 167 provides a low pass frequency response. These components also provide phase shift.

Figure 4:
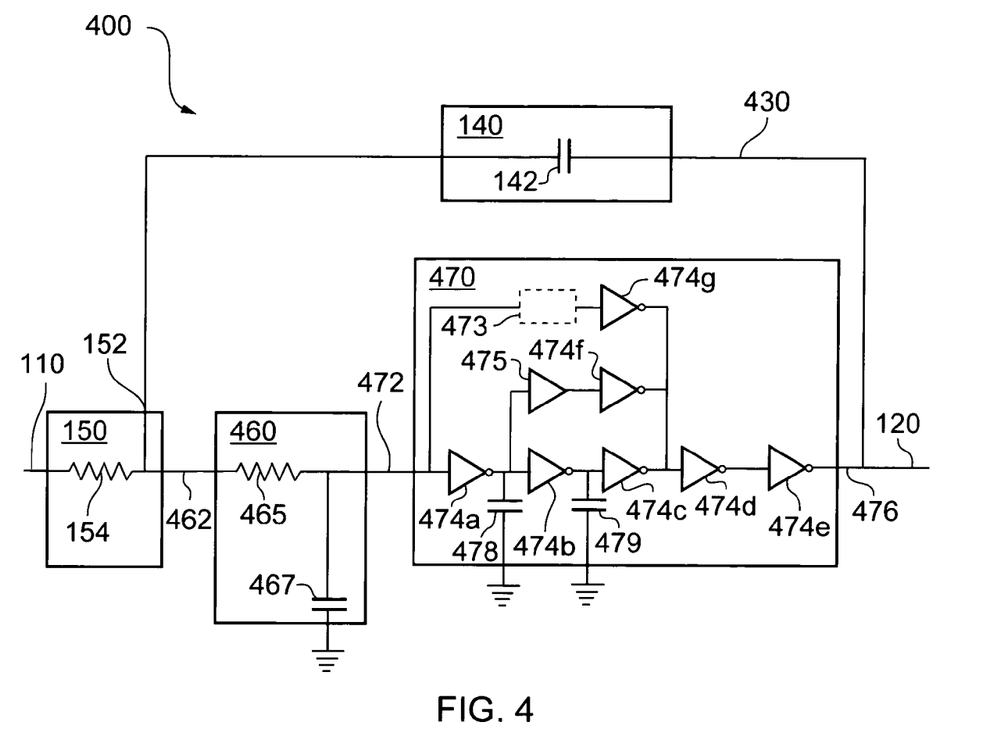
FIG. 4 is a schematic diagram of an integrator.

The amplification and phase shifting element 170 comprises first to fifth inverters 174a-e coupled in series. The number of inverters 174a-e illustrated in the embodiment of FIG. 4 is five, but different numbers may be used. An odd number of inversions in the loop is required for integration and oscillation. However, if an inversion takes place in the summing stage 150 or in the filter 160, the amplification and phase shifting element 170 can have an even number of inverters 174a-e. The first inverter 174a amplifies the signal delivered to it by the filter 160 to produce a limited signal having an amplitude corresponding to the voltage difference between supply rails. The subsequent inverters 174b-e successively increase the slope of the limited signal and provide delay, or equivalently, phase shift. The selected number of the inverters 174a-e depends on the desired oscillation frequency and desired amplification, and on the extent of any phase shift provided in other components of the loop. In other embodiments a single inverter 174a-e may be sufficient, or more than five inverters 174a-e may be employed. The output 120 can, as illustrated in FIG. 3, be coupled to the output 176 of the amplification and phase shifting element 170, which is coupled to the output of the fifth inverter 174e. Alternatively, the output 120 may be coupled to the output of one other of the inverters 174a-e, if the form of the oscillation signal at any of these points is suitable for any subsequent stages of signal processing which in use may be coupled to the output 120.

The capacitive element 140 comprises a capacitor 142 coupled in series in the feedback path 130. Alternative means of providing capacitance in series in the feedback path 130 may be used, for example a capacitive semiconductor junction. The capacitance of the capacitor 142 is chosen in conjunction with the resistance of the resistive element 154 to provide an integration time constant suitable for the bandwidth of interest in the input signal.

FIG. 4 illustrates an integrator 400 which has an amplification and phase shifting element 470 with a different configuration than the amplification and phase shifting element 170 of FIG. 3 and a filter 460 with a different configuration than the filter 160 of FIG. 3. Elements in common between FIGS. 3 and 4 have the same reference numeral in both FIGS. 3 and 4 and will not be described again. A feedback path 430 comprises the capacitive element 140, the summing stage 150 and the filter 460.

The filter 460 has an input 462 coupled to the output of the summing stage 150, and an output coupled to the input 472 of the amplification and phase shifting element 470. There is a resistive element 465 coupled between the input 462 and output of the filter 460. Coupled from intermediate the resistive element 465 and the output of the filter 460 to ground is a capacitive element 467. The combination of the resistive element 465 and the capacitive element 467 provide a low pass frequency response, and also provide phase shift. Typically this phase shift is approximately 90 degrees at the oscillation frequency.

The amplification and phase shifting element 470 provides a plurality of signal paths. A first signal path through the amplification and phase shifting element 470 comprises first to fifth inverters 474a-e coupled in series between an input 472 and an output 476 of the amplification and phase shifting element 470. There is also a capacitive element 478 coupled between the input of the second inverter 474b and ground, and a capacitive element 479 coupled between an input of the third inverter 474c and ground. These capacitive elements 478, 479, in conjunction with the input impedance of the second and third inverters 474b, 174c, provide additional filtering, attenuating frequencies at the oscillation frequency and higher to ensure that the second and third inverters 474b, 474c are able to provide amplification, in addition to the amplification provided by the first inverter 174a. At least the first and second inverters 474a, 474b may be operated in a non-limiting mode, such that the signals at their respective outputs need not have the maximum amplitude corresponding to the voltage difference between supply rails. Indeed, the capacitive elements 478, 479 may load their respective preceding inverters 474a, 474b to increase the rise times of signals at the outputs of these inverters 474a, 474b and prevent limiting. In this way the capacitive elements 478, 479 also provide phase shifting within the loop.

A second signal path through the amplification and phase shifting element 470 comprises an inverting stage 475 and a sixth inverter 474f coupled in series between the input of the second inverter 474b and an input of the fourth inverter 474d, and also comprises the first, fourth and fifth inverters 474a, 474d, 474e. Thus the inverting stage 475 and the sixth inverter 474f are coupled in parallel to the combination of the second and third inverters 474b, 474c. The inverting stage 475, which can have unity gain, ensures that the second signal path includes an odd number of signal inversions. In embodiments employing differential signals, the inverting stage 475 may be simply implemented by using the inverse signal of a differential signal pair.

A third signal path through the amplification and phase shifting element 470 comprises an optional phase shifting network 473 and a seventh inverter 474g coupled in series between an input of the first inverter 474a and the input of the fourth inverter 474d, and also comprises the fourth and fifth inverters 474d, 474e. Thus the optional phase shifting network 473 and the seventh inverter 474g are coupled in parallel to the series combination of the first, second and third inverters 474a, 474b, 474c. The third signal path also includes an odd number of signal inversions. The third signal path contributes to determining the oscillation frequency by providing phase shift. The use of a phase shifting network 473 which is passive enables a lower power consumption than the use of additional inverters, or the use of increased capacitance to load the outputs of the inverters 474a-c, to provide phase shift.

By means of the plurality of signal paths through the amplification and phase shifting element 470, the amplification and phase shifting element 470 can provide greater stability than obtained with the single signal path provided by the first to fifth inverters 174a-e of the amplification and phase shifting element 170 of FIG. 3, thereby ensuring that the loop oscillates only at the desired high oscillation frequency and does not oscillate at a low frequency.

The output 120 can, as illustrated in FIG. 4, be coupled to the output 476 of the amplification and phase shifting element 470, which is coupled to the output of the fifth inverter 474e.

Alternatively, the output 120 may be coupled to another location in the amplification and phase shifting element 470, for example an output of the fourth inverter 474d or of the third inverter 474c.

In some applications it may be desirable to have the input signal at the input 110 of the integrator 100, 200, 300, 400 and the signal at the output 120 in a differential format, for example for improved power supply noise immunity. Therefore, an integrator may be implemented using differential signals. In particular, such an integrator can comprise a loop for each signal of a differential pair of input signals.

Figure 5:
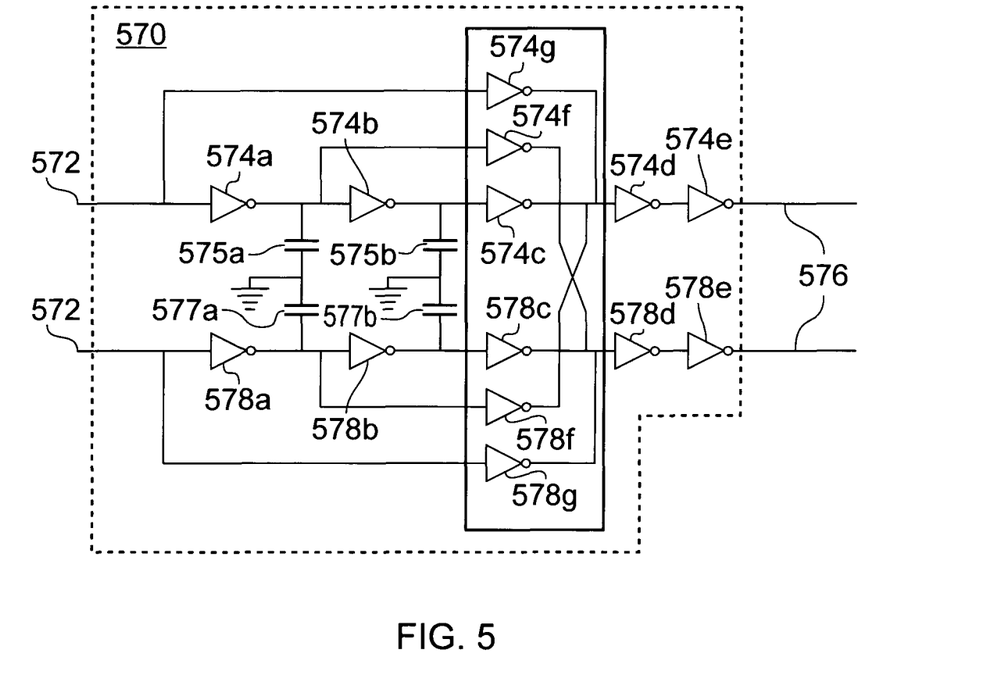
FIG. 5 is a schematic diagram of an amplification and phase shifting element.

FIG. 5 illustrates an amplification and phase shifting element 570 that may be used for differential signals in an integrator 100, 200. Referring to FIG. 5, there is a pair of inputs 572 for a differential signal pair and a pair of outputs 576 for a differential signal pair. A first signal path for one signal of the signal pair comprises inverters 574a-e coupled in series between one of the inputs 572 and one of the outputs 576. A first signal path for the other signal of the signal pair comprises inverters 578a-e coupled in series between the other of the inputs 572 and the other of the outputs 576. Outputs of the inverters 574a-b and 586a-b are coupled to ground, or alternatively a reference voltage, via capacitors 575a-b and 577a-b respectively.

Additional signal paths through the amplification and phase shifting element 570 are provided. A second signal path for one signal of the signal pair comprises an inverter 574f having an input coupled to the output of the inverter 574a and an output coupled to the input of inverter 578d, and also includes the inverters 574a, 578d and 578e. A second signal path for the other signal of the signal pair comprises an inverter 578f having an input coupled to the output of the inverter 578a and an output coupled to the input of inverter 574d, and also includes the inverters 578a, 574d and 574e.

A third signal path for one signal of the signal pair comprises an inverter 574g having an input coupled to an input of the inverter 574a and an output coupled to the input of inverter 574d, and also includes the inverters 574d and 574e. A third signal path for the other signal of the signal pair comprises an inverter 578g having an input coupled to an input of the inverter 578a and an output coupled to the input of inverter 578d, and also includes the inverters 578d and 578e. Outputs of the inverters 574e and 578e are coupled to respective outputs 576 of the amplification and phase shifting element 570 for differential signals.

Figure 10:
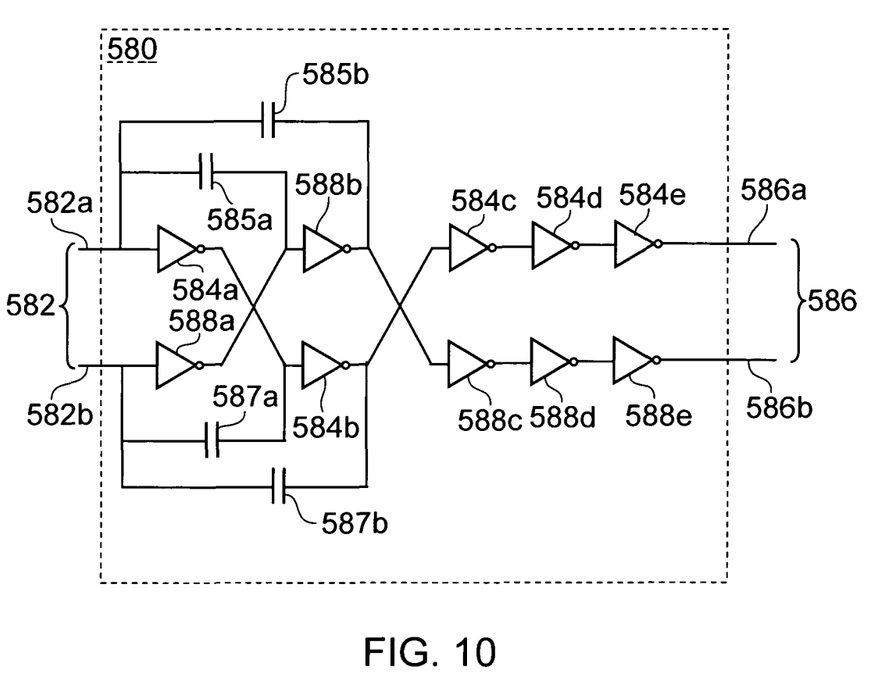
FIG. 10 is a schematic diagram of an amplification and phase shifting element.

FIG. 10 illustrates another amplification and phase shifting element 580 that may be used for differential signals in an integrator 100, 200. Referring to FIG. 10, there is a differential input 582 having a first differential component input 582a and a second differential component input 582b. There is a differential output 586 having a first differential component output 586a and a second differential component output 586b. A first signal path for one signal component of a differential signal comprises first to fifth series-coupled inverters 584a-e coupled in series between the first differential component input 582a and the first differential component output 586a. A second signal path for another signal component of the differential signal comprises sixth to tenth series-coupled inverters 588a-e coupled in series between the second differential component input 582b and the second differential component output 586b. A first cross-coupled capacitive element 585a is coupled between the first differential component input 582a and an output of the sixth series-coupled inverter 588a, which is positioned first in the series arrangement of the sixth to tenth series-coupled inverters 588a-e. A second cross-coupled capacitive element 587a is coupled between the second differential component input 582b and an output of the first series-coupled inverter 584a, which is positioned first in the series arrangement of the first to fifth series-coupled inverters 584a-e. A third cross-coupled capacitive element 585b is coupled between the first differential component input 582a and an output of the seventh series-coupled inverter 588b, which is positioned second in the series arrangement of the sixth to tenth series-coupled inverters 588a-e. A fourth cross-coupled capacitive element 587b is coupled between the second differential component input 582b and an output of the second series-coupled inverter 584b, which is positioned second in the series arrangement of the first to fifth series-coupled inverters 584a-e.

The amplification and phase shifting element 580 illustrated in FIG. 10 is advantageous in having a lower power consumption than the amplification and phase shifting element 570 illustrated in FIG. 5. It is advantageous in this way because, by employing the first to fourth cross-coupled capacitive elements 585a, 587a, 585b, 587b, the need for the additional signal paths of the amplification and phase shifting element 570 illustrated in FIG. 5 is avoided, and therefore the power consumption of inverters in the additional signal paths is avoided. Specifically, it does not require the inverters 574f, 574g, 578f, 578g. In a generalisation of the amplification and phase shifting element 570 illustrated in FIG. 10, more or fewer series coupled inverters 584a-e, 588a-e may be provided in the first and second signal paths, and more or fewer of the cross-coupled capacitive elements 585a, 587a, 585b, 587b may be provided coupled between the first and second differential component inputs 582a, 582b and outputs of respective ones of the series coupled inverters 584a-e, 588a-e. Such alternative numbers may be selected depending on the desired transfer function for amplification and phase shifting.

Figure 6:
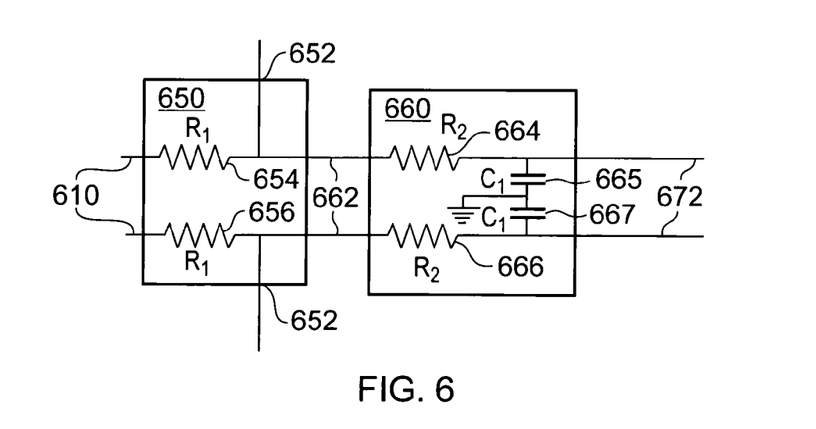
FIG. 6 is a schematic diagram of a summing stage and a filter.

FIG. 6 illustrates a summing stage 650 and a filter 660 suitable for differential signals. The summing stage 650 comprises resistive elements 654, 656 having an equal value $R_1$ coupled between first inputs 610 of the summing stage 650 and outputs of the summing stage 650, in respective differential signal paths. Second inputs 652 of the summing stage 650 are coupled intermediate the resistive elements 654, 656 and the respective outputs 652 for the respective differential signal paths.

The outputs of the summing stage 650 are coupled to inputs 662 of the filter 660 in respective differential signal paths. The filter 660 comprises resistors 664, 666 having an equal value $R_2$ coupled between the inputs 662 of the filter 660 and the outputs 672 of the filter 660, in respective differential signal paths. Capacitive elements 665, 667 having an equal value $C_1$ are coupled to ground, or alternatively to a reference voltage, from intermediate the respective resistive elements 664, 666 and the outputs 672 of the filter 660.

Figure 7:
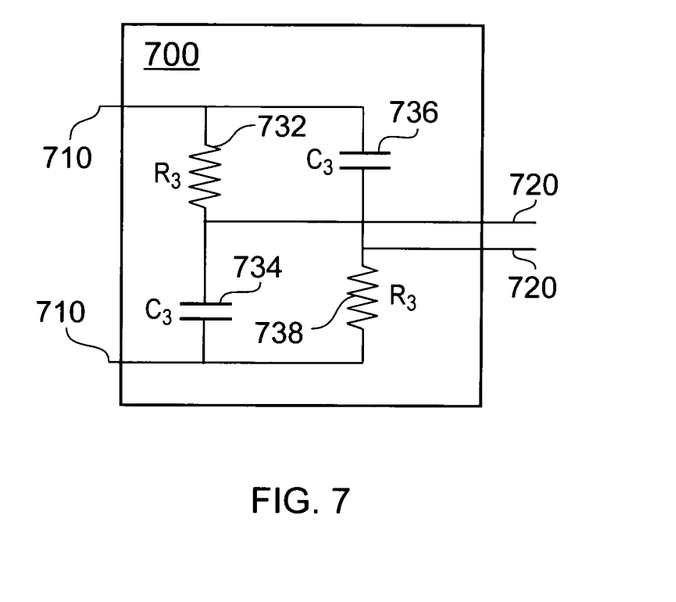
FIG. 7 is a schematic diagram of a phase shifting network.

FIG. 7 illustrates a phase shifting network 700 for differential signals and which may, for example, be used in the third signal path of the amplification and phase shifting element 570 in a corresponding manner to the phase shifting network 473 in the integrator 400 of FIG. 4. Referring to FIG. 7, the phase shifting network 700 has inputs 710 for a differential signal pair. Coupled in series between the inputs 710 are a first resistive element 732 having resistance $R_3$ and a first capacitive element 734 having capacitance $C_3$. Also coupled in series between the inputs 710 in a complementary manner to the first resistive element 732 and a first capacitive element 734 are a second capacitive element 736 having a capacitance $C_3$ and a second resistive element 738 having resistance $R_3$. Outputs 720 of the phase shifting network 700 for a differential signal pair are coupled, respectively, intermediate the first resistive element 732 and a first capacitive element 734 and intermediate the second capacitive element 736 and the second resistive element 738. The phase shifting network 700 has unity gain at all frequencies and can provide a phase shift of –90 degrees at the frequency $1/2\pi R_3 C_3$, zero degrees at relatively low frequencies, and –180 degrees at relatively high frequencies.

Figure 8:
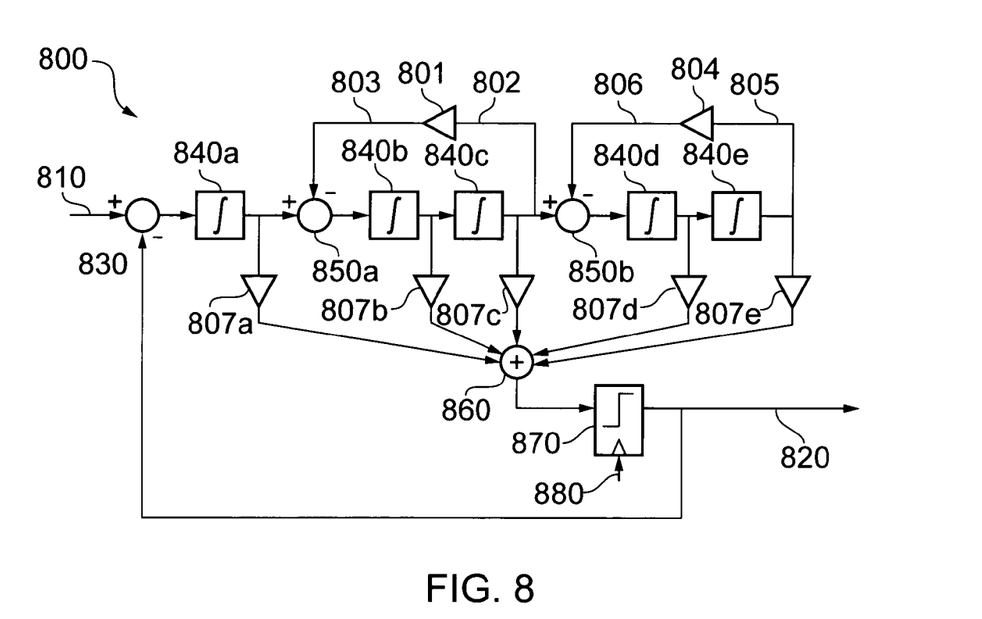
FIG. 8 is a schematic diagram of a sigma-delta analogue-to-digital converter.

FIG. 8 illustrates a sigma-delta analogue-to-digital converter 800. The sigma-delta analogue-to-digital converter 800 comprises an input 810 for an analogue signal. The input 810 is coupled to a non-inverting input of a subtraction stage 830. An output of the subtraction stage 830 is coupled to an input of an integrator 840a. An output of the integrator 840a is coupled to a non-inverting input of a subtraction stage 850a. An output of the subtraction stage 850a is coupled to an input of an integrator 840b. An output of the integrator 840b is coupled to an input of an integrator 840c, and an output of the integrator 840c is coupled to a non-inverting input of a subtraction stage 850b. An output of the subtraction stage 850b is coupled to an input of an integrator 840d, and an output of the integrator 840d is coupled to an input of an integrator 840e.

An output of the integrator 840c is coupled via an amplifier 801, having an input 802 and an output 803, to an inverting input of the subtraction stage 850a. Therefore, the subtraction stage 850a delivers a difference signal to the input of the integrator 840b, this difference signal being the difference between a signal at its non-inverting input and a signal at its inverting input. In a corresponding manner, an output of the integrator 840e is coupled, via an amplifier 804, having an input 805 and an output 806, to an inverting input of the subtraction stage 850b. Therefore, the subtraction stage 850b delivers a difference signal to the input of the integrator 840d, this difference signal being the difference between the signal at its non-inverting input and the signal at its inverting input. The outputs of the integrators 840a to 840e are each coupled via respective amplifiers 807a-e to respective inputs of a summing stage 860. An output of the summing stage 860 is coupled to an input of a comparator 870 for delivering to the comparator 870 a sum of the signals at its inputs. The comparator 870 has a further input 880 for a clock signal, and delivers at an output 820 a two-level signal having a polarity which is indicative, at time intervals corresponding to the period of the clock signal, of whether the sum of signals at the input of the comparator 870 is above or below a comparator threshold. The output 820 is coupled to an inverting input of the subtraction stage 830; therefore the subtraction stage 830 delivers a difference signal to the input of the integrator 840a, this difference signal being the difference between the signal at the input 810 and the signal at the output 7820.

Any, or preferably all, of the integrators 840a-e can be identical to the integrators 100, 200, 300, 400 or their variants described herein. Sigma-delta analogue-to-digital converters having architectures other than that described herein may employ the integrators 100, 200, 300, 400 or their variants described herein.

Figure 9:
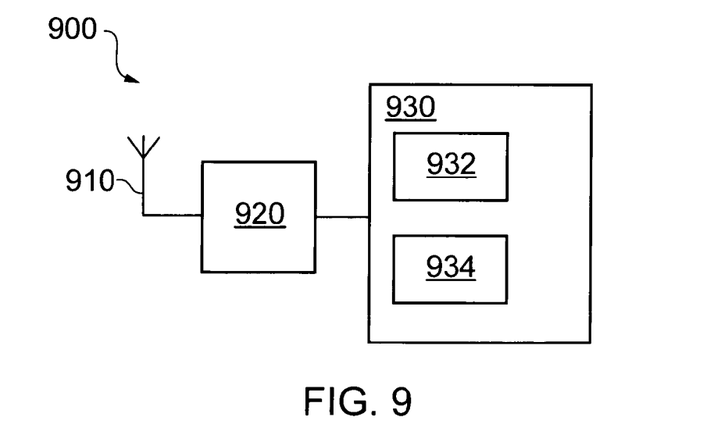
FIG. 9 is a block schematic diagram of a mobile communication device.

FIG. 9 illustrates a mobile communication device 900 comprising an antenna 910 for receiving and emitting radio frequency signals. The antenna 910 is coupled to a transceiver 920, and the transceiver 920 is coupled to a baseband signal processor 930. The transceiver 920 amplifies, filters, and converts to a lower frequency, radio frequency signals received by the antenna 910, and passes the resulting signal to the baseband signal processor 930. The baseband signal processor 930 comprises an analogue-to-digital converter 932 for digitising the signal received from the transceiver 920. The baseband signal processor 930 demodulates and decodes the digitised signal in order to extract information. The baseband signal processor 930 also encodes information to be transmitted and modulates, in the digital domain, the encoded information onto a carrier signal. The baseband signal processor 930 comprises a digital-to-analogue converter 934 for converting the carrier signal to the analogue domain. The resulting analogue signal is passed to the transceiver 920 for conversion to a radio frequency and for amplification, and the resulting amplified radio frequency signal is passed to the antenna 910 for emission. The analogue-to-digital converter 932 may be identical to the sigma-delta analogue-to-digital converter described with reference to FIG. 8 or any of its variants described herein.

The mobile communication device 900 may employ other architectures, in particular employing the analogue-to-digital converter 932 at different locations. For example, the radio frequency signal received by the transceiver 920 may be digitised prior to conversion to a lower frequency.

The resistive element 154 in FIGS. 3 and 5 is illustrated as independent elements, but in practice this element may be provided by the output impedance of a signal source coupled to the input 110.

Although embodiments have been described in which amplification and phase shifting are performed in a common element, specifically amplification and phase shifting element 170, 470, 570, 580 this is not essential and the amplification and phase shifting may be provided in separate elements.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. An integrator comprising:
   a loop operable to oscillate at an oscillation frequency, the loop comprising:
      a first branch, the first branch comprising a first node, a second node, and a capacitive element series coupled between the nodes of the first branch to cause the loon oscillation at said oscillation frequency;
      a second branch comprising a first node and a second node connected to said node of the first branch and to an output of the loop for delivering said oscillation signal, the second branch further comprising series coupled between the nodes of the second branch:
         an amplifier stage for amplification;
         a filter stage for filtering; and
         a phase shifter for providing a phase shift; and
      a summing stage, comprising
         a first input for summing an input signal into the loop, the input signal having a bandwidth lower than the oscillation frequency;
         a second input electrically coupled to the first node of the first branch; and
         an output electrically coupled to the first node of the second branch; and
      wherein the oscillation signal is dependent upon an integral of the input signal.

2. An integrator as claimed in claim 1 wherein the summing stage is arranged to sum the input signal and the oscillation signal, thereby causing the oscillation signal to be pulse width modulated by an integral of the input signal.

3. An integrator as claimed in claim 1 wherein the filter stage is operable to attenuate spectral components at the oscillation frequency relative to spectral components in the bandwidth of the input signal.

4. An integrator as claimed in claim 1:
   wherein the amplification stage and phase shifter are provided as an amplification and phase shifting element; and
   wherein the filter stage is coupled intermediate an output of the summing stage and an input of the amplification and phase shifting element.

5. An integrator as claimed in claim 1:
   wherein the amplification stage and the phase shifter are provided as an amplification and phase shifting element;
   wherein the filter stage is coupled intermediate an output of the amplification and phase shifting element and the second node of the second branch.

6. An integrator as claimed in claim 4,
   wherein the amplification and phase shifting element comprises a first signal path having a first plurality of inverters coupled in series.

7. An integrator as claimed in claim 6 wherein the amplification and phase shifting element comprising at least one further signal path including a parallel-coupled inverter coupled in parallel to one or more of the inverters of the first plurality of inverters of the first signal path.

8. An integrator as claimed in claim 7 wherein the at least one of further signal path includes a phase shifting network.

9. An integrator as claimed in claim 1 configured to receive the input signal as a differential signal and to deliver the oscillation signal as a differential signal.

10. An integrator as claimed in claim 1:
    wherein the amplification stage and phase shifter are provided as an amplification and phase shifting element;
    wherein the amplification and phase shifting element is adapted for processing the oscillation signal as a differential signal,
    the amplification and phase shifting element comprising:
       a differential input having a first differential component input and a second differential component input;
       a differential output having a first differential component output and a second differential component output;
       a first signal path having a first plurality of inverters coupled in series between the first differential component input and the first differential component output;
       a second signal path having a second plurality of inverters coupled in series between the second differential component input and the second differential component output;
       a first cross-coupled capacitive element coupled between the first differential component input and an output of one inverter of the second plurality of inverters;
       a second cross-coupled capacitive element coupled between the second differential component input and an output of one inverter of the first plurality of inverters.

11. An integrator as claimed in claim 6 wherein at least one of the inverters comprises a Standard Voltage Threshold transistor.

12. An integrator as claimed in claim 1 wherein the series coupled capacitive element comprises a series coupled resistive element.

13. An integrator as claimed in claim 1 wherein the series coupled capacitive element comprises a series coupled resistive element.

14. A circuit comprising:
   at least one integrator comprising:
      a loop operable to oscillate at an oscillation frequency, the loop comprising:
         a first branch, the first branch comprising a first node, a second node, and a capacitive element series coupled between the nodes of the first branch to cause the loon oscillation at said oscillation frequency;
         a second branch comprising a first node and a second node connected to said second node of the first branch and to an output of the loop for delivering said oscillatiOn signal, the second branch further comprising series coupled between the nodes of the second branch:
            an amplifier stage for amplification;
            a filter stage for filtering; and
            a phase shifter for providing a phase shift; and
         a summing stage, comprising
            a first input for summing an input signal into the loop, the input signal having a bandwidth lower than the oscillation frequency;
            a second input electrically coupled to the first node of the first branch; and an output electrically coupled to the first node of the second branch; and
         wherein the oscillation signal is dependent upon an integral of the input signal; and
      a filter coupled to the output of the at least one integrator for providing attenuation at the oscillation frequency.

15. A circuit as claimed in claim 14 wherein the circuit is one of a sigma-delta analogue-to-digital converter, a filter, a control loop, an analogue-to-digital converter, a digital-to-analogue converter.

16. A mobile communication device comprising:
   a circuit comprising:
      at least one integrator comprising:
         a loop operable to oscillate at an oscillation frequency, the loop comprising:
            a first branch, the first branch comprising a first node, a second node, and a capacitive element series coupled between the nodes of the first branch to cause the loon oscillation at said oscillation frequency;
            a second branch comprising a first node and a second node connected to said second node of the first branch and to an output of the loop, the second branch further comprising series coupled between the nodes of the second branch:
               an amplifier stage for amplification;
               a filter stage for filtering; and
               a phase shifter for providing a phase shift; and
            a summing stage, comprising
               a first input for summing an input signal into the loop, the input signal having a bandwidth lower than the oscillation frequency;
               a second input electrically coupled to the first node of the first branch; and
               an output electrically coupled to the first node of the second branch; and
            wherein the oscillation signal is dependent upon an integral of the input signal;
      a filter coupled to the output of the at least one integrator for providing attenuation at the oscillation frequency.

17. A method of integration comprising:
generating an oscillation signal having an oscillation frequency at an output terminal by providing amplification, filtering, and phase shifting in a first branch of a loop from said output terminal to cause the loop oscillation at said oscillation frequency;
providing a capacitance series coupled in a feedback branch of the loop from said output terminal to cause the loop oscillation at said oscillation frequency;
summing an input signal into the loop with a the oscillation signal on the feedback branch to generate said summing signal; the input signal having a bandwidth lower than the oscillation frequency; and
delivering to said output terminal of the loop the oscillation signal dependent upon an integral of the input signal.

* * * * *